(12) United States Patent
Wu et al.

(10) Patent No.: US 8,525,261 B2
(45) Date of Patent: Sep. 3, 2013

(54) SEMICONDUCTOR DEVICE HAVING A SPLIT GATE AND A SUPER-JUNCTION STRUCTURE

(75) Inventors: Shyi-Yuan Wu, Hsinchu (TW); Wing Chor Chan, Hsinchu (TW); Chien-Wen Chu, Taoyuan (TW)

(73) Assignee: Macronix International Co., Ltd. (TW)

( * ) Notice: Subject to any disclaimer, the term of this patent is extended or adjusted under 35 U.S.C. 154(b) by 267 days.

(21) Appl. No.: 12/953,200

(22) Filed: Nov. 23, 2010

(65) Prior Publication Data

US 2012/0126323 A1   May 24, 2012

(51) Int. Cl.
*H01L 29/66* (2006.01)

(52) U.S. Cl.
USPC .......... 257/343; 257/335; 257/E29.031; 257/E29.12; 257/E29.187; 257/E29.261; 438/316

(58) Field of Classification Search
USPC .......... 257/343, E29.256, E29.031; 438/316
See application file for complete search history.

(56) References Cited

U.S. PATENT DOCUMENTS

| | | | |
|---|---|---|---|
| 6,696,728 B2 | 2/2004 | Onishi et al. | |
| 6,710,416 B1* | 3/2004 | Xu | 257/409 |
| 7,192,834 B2 | 3/2007 | Hsu et al. | |
| 2005/0017300 A1* | 1/2005 | Salama et al. | 257/342 |
| 2005/0106791 A1 | 5/2005 | You et al. | |
| 2008/0138954 A1* | 6/2008 | Cai | 438/285 |

* cited by examiner

*Primary Examiner* — Thao Le
*Assistant Examiner* — Matthew Gordon
(74) *Attorney, Agent, or Firm* — Baker & McKenzie LLP

(57) ABSTRACT

A semiconductor device comprises a source region, a drain region, and a drift region between the source and drain regions. A split gate is disposed over a portion of the drift region, and between the source and drain regions. The split gate includes first and second gate electrodes separated by a gate oxide layer. A super-junction structure is disposed within the drift region between the gate and the drain region.

28 Claims, 10 Drawing Sheets

SEMICONDUCTOR DEVICE HAVING A SPLIT GATE AND A SUPER-JUNCTION STRUCTURE

BACKGROUND

1. Technical Field

The present application relates generally to semiconductor devices, include semiconductor devices used in high voltage applications.

2. Related Art

Laterally diffused metal oxide semiconductor (LDMOS) devices are typically used in high voltage applications. FIG. 1 shows an example of a conventional LDMOS. The LDMOS in FIG. 1 includes a high-voltage N-well (HVNW) region 102 on a P-type substrate 100. A P-type well 110 and a N-type well 120 are formed in the HVNW region 102. A gate is formed by a gate oxide layer 175 and a polysilicon gate layer 170. Also, a portion of the gate layer 170, referred to as the field plate, extends over a central field oxide (FOX) region 162. The relatively thick central FOX region 162 serves to increase the breakdown voltage of the device by reducing electric field crowding at the gate edge. Further, two additional FOX regions 160 and 164 are formed, one at each side of the LDMOS device, which serve to isolate the device from other devices. An N+ doped region 180 is formed within the N-type well 120 in order to form a drain region, and another N+ doped region 185 is formed in the P-type well 110 in order to form a source region. In addition, with regard to the N+ doped region 185 formed in the P-type well 110, an adjacent P+pickup region 190 is provided to reduce resistivity. The LDMOS device shown in FIG. 1 can be manufactured as disclosed by U.S. Pat. No. 7,192,834, which is hereby incorporated by reference.

When designing LDMOS devices, it is desirable for the device to have a very high breakdown voltage ($V_{bd}$), while also exhibiting a low on-resistance ($R_{on}$) during operation. LDMOS devices having a low on-resistance and a high breakdown voltage will typically exhibit a relatively lower power loss when used for high-voltage applications. One problem when designing such LDMOS devices is that techniques and structures that tend to maximize the breakdown voltage $V_{bd}$ tend to adversely affect the on-resistance $R_{on}$, and vice versa.

Thus, it is desirable to find new approaches for improving trade-off between the breakdown voltage and on-resistance of LDMOS devices, particularly so as to allow for shrinking the feature size of LDMOS devices without degrading the device characteristics.

SUMMARY

Systems and methods for manufacturing power devices, such as LDMOS devices or extended drain MOSFET (EDMOS) devices, are described herein. According to one aspect of the present disclosure, a semiconductor device is disclosed that comprises a source region, a drain region, a drift region between the source and drain regions, and a split gate disposed over a portion of the drift region, and between the source and drain regions. The split gate includes first and second gate electrodes that are separated by a gate oxide layer. The semiconductor device also includes a super-junction structure that is disposed within the drift region, between the gate and the drain regions.

The split gate can include a first gate oxide layer over the drift region, a first gate electrode layer formed over a first portion of the first gate oxide layer, a second gate oxide layer formed over a second portion of the first gate oxide layer and over a portion of the first gate electrode layer, and a second gate electrode layer formed over the second gate oxide layer. The split gate can further comprise a third gate electrode layer formed over a third portion of the first gate oxide layer, where the second gate oxide layer is further formed over a fourth portion of the first gate oxide layer between the first and third gate electrode layers.

The semiconductor device can further comprise a pickup region adjacent to the source region. The pickup and source regions can be of opposite conductivity types.

The drift region can include material of a first conductivity type, and the super-junction structure can comprise a plurality of pillars of a second conductivity type opposite the first conductivity type. The super junction structure can also comprise a second plurality of pillars of the first conductivity type. The pillars can be spaced apart from each other by material of the first conductivity type. The first conductivity type can be, for example, n-type material, while the second conductivity type can be p-type material. The plurality of pillars can include at least one pillar having a cross-sectional shape that is at least somewhat in the form of one of a rectangle, square, hexagon, circle, and trapezoid.

The drift region can be formed in a high-voltage N-well (HVNW) region.

The semiconductor device can further comprise a buffer region below the drain region. The buffer region can be a buffer region layer having an at least substantially constant thickness, or the buffer region can be a buffer region layer having a varying thickness.

According to other aspects of the present disclosure, a semiconductor device can comprise a semiconductor layer of a first conductivity type, a drain region of the first conductivity type formed over the semiconductor layer, and a source region of the first conductivity type formed over the semiconductor layer and spaced apart from the drain region such that a drift region is formed between the drain region and the source region. The semiconductor device can also comprise a first gate oxide layer over the drift region, a first gate electrode layer formed over a first portion of the first gate oxide layer, a second gate oxide layer formed over a second portion of the first gate oxide layer and over a portion of the first gate electrode layer, and a second gate electrode layer formed over the second gate oxide layer. The semiconductor device can further comprise a super-junction structure formed in at least a portion of the drift region. The super junction structure can include a plurality of pillars of a second conductivity type that is opposite the first conductivity type.

The first conductivity type can be, for example, an n-type material, while the second conductivity type can be, for example, a p-type material.

The super junction structure can comprise a plurality of pillars of the second conductivity type. The super-junction structure can comprises a second plurality of pillars of the first conductivity type. The pillars can be spaced apart from each other by material of the first conductivity type. The plurality of pillars can include at least one pillar having a cross-sectional shape that is at least somewhat in the form of one of a rectangle, square, hexagon, circle, and trapezoid.

The semiconductor device can further comprise a first region of the first conductivity type formed as a first well in the semiconductor layer, and a second region of the second conductivity type formed as a second well in the semiconductor layer. The drain region can be formed in the first region, and the source region can be formed in the second region. The semiconductor device can further comprise a pickup region of the second conductivity type formed in the second region. The semiconductor device can further comprise a buffer region of the first conductivity type below the drain region. The buffer region can be a buffer region layer having an at least substantially constant thickness. The buffer region can be a buffer region layer having a varying thickness.

The semiconductor device can further comprise a third gate electrode layer formed over a third portion of the first gate oxide layer, where the second gate oxide layer is further formed over a fourth portion of the first gate oxide layer between the first and third gate electrode layers.

These and other features, aspects, and embodiments of the invention are described below in the section entitled "Detailed Description.".

BRIEF DESCRIPTION OF THE DRAWINGS

Features, aspects, and embodiments of the inventions are described in conjunction with the attached drawings, in which.

DETAILED DESCRIPTION

Disclosed herein is a system and method for manufacturing power devices, for example an LDMOS device or an extended drain MOSFET (EDMOS) device, having a split gate and a super junction in the drift region. The split gate can be made, for example, using a second polysilicon layer and a high temperature oxide (HTO) film, general process layers in a polysilicon-insulator-polysilicon (PIP) capacitor, and high-resistance polysilicon. The split gate introduces a gate extension that can reduce the peak electric field and therefore allow for a relatively shorter drift region. The super junction in the drift region can further allow for a reduction in the size of the drift region, while still maintaining desirable on-resistance $R_{on}$ and breakdown voltage $V_{bd}$ values. Therefore, the disclosed power device area can be reduced compared to prior power devices. The present disclosure can also provide for a power device, such as an LDMOS device, having an improved trade-off between on-resistance $R_{on}$ and breakdown voltage $V_{bd}$ over prior power devices.

Figure 1:
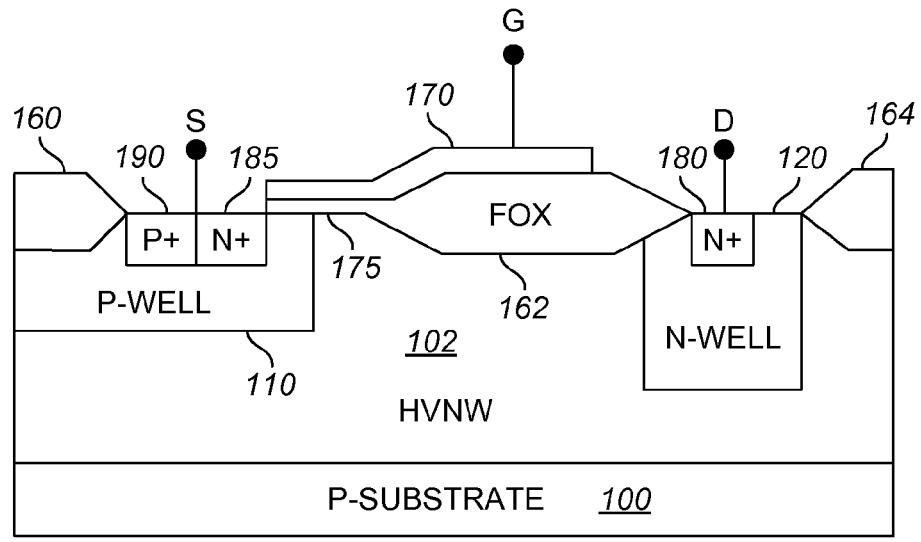
FIG. 1 shows a cross-sectional view of a conventional LDMOS.
Figure 2:
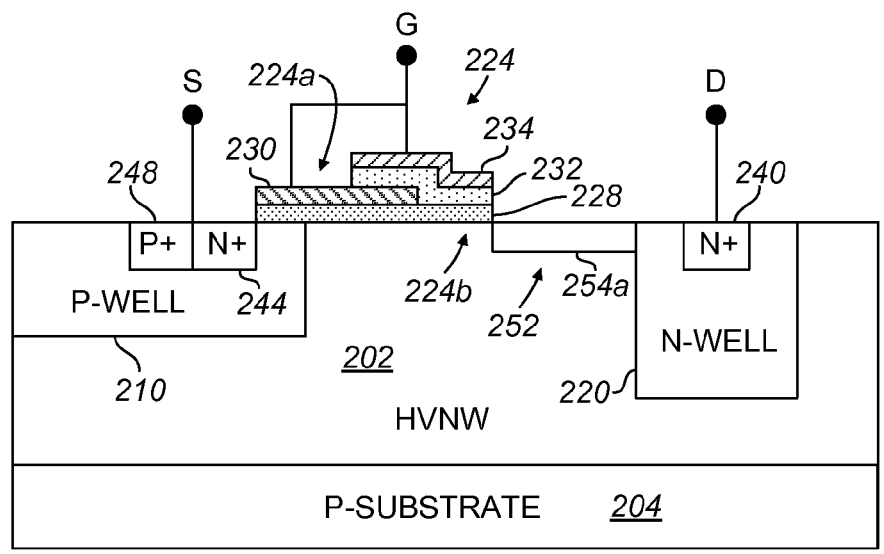
FIG. 2 shows a cross-sectional view of an LDMOS in accordance with an embodiment of the present disclosure.

FIG. 2 shows a cross-sectional diagram schematically illustrating an LDMOS device in accordance with some embodiments of the present disclosure. The LDMOS shown in FIG. 2 includes a high-voltage N-well (HVNW) region 202 on a P-type substrate 204. A P-type well 210 and a N-type well 220 are formed in the HVNW region 202. For the purposes of describing this and other embodiments, it is assumed that the substrate is a P-type substrate, and that certain wells are formed of N- and P-type well regions. However, it will be appreciated by those skilled in that art that the dopant types of the various regions can be changed so as to produce P-type devices instead of N-type devices, and vice versa.

The LDMOS shown in FIG. 2 includes a split gate 224. The split gate 224 includes a first gate oxide layer 228, a first polysilicon layer 230, an HTO layer 232 (second gate oxide layer), and a second polysilicon layer 234. The first and second polysilicon layers 230 and 234 constitute examples of first and second gate electrodes of the split gate 224. An N+ doped region 240 is formed within the N-type well 220 in order to form a drain region, and another N+ doped region 244 is formed in the P-type well 210 in order to form a source region. In addition, with regard to the N+ doped region 244 formed in the P-type well 210, an adjacent, and preferrably adjoining, P+ pickup region 248 is provided to reduce resistivity.

A first portion 224a of the split gate 224 can extend over at least a portion of the P-type well 210. The first portion 224a of the split gate 224 can extend to be adjacent or adjoining to the N+ doped region 244 of the source region. Such an arrangement allows for the N+ doped region 244 to be formed in the exposed surface of the substrate (i.e. a portion not covered by the layers of the gate 224). The N+ doped region 244, as well as the N+ doped region 240 and P+ pickup region 248, can be formed through conventional masking processes, for example by selective doping of the substrate in the desired regions. The selective doping process can be performed with any conventional method, such as diffusion and/or ion implantation.

A second portion 224b of the split gate 224 extends between the first portion 224a and the N+ doped region 240 that forms the drain region. The second portion 224b of the split gate 224 is separated from the N-type well 220 and the N+ doped region 240 by a drift region 252. As discussed in connection with embodiments described below, a super-junction region can be included in the drift region 252. The super-junction region of the drift region 252 can allow for a relatively small drift region, such as a relatively short distance between the gate 224 and the drain region.

Figure 10:
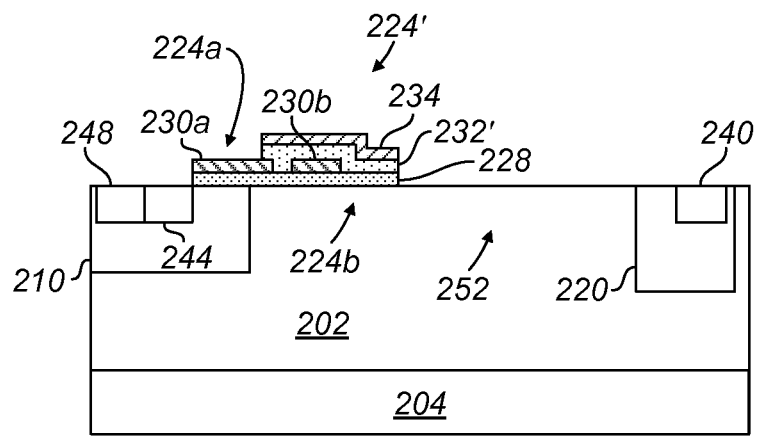
FIG. 10 shows a cross-sectional view of an LDMOS in accordance with an embodiment of the present disclosure.
Figure 11:
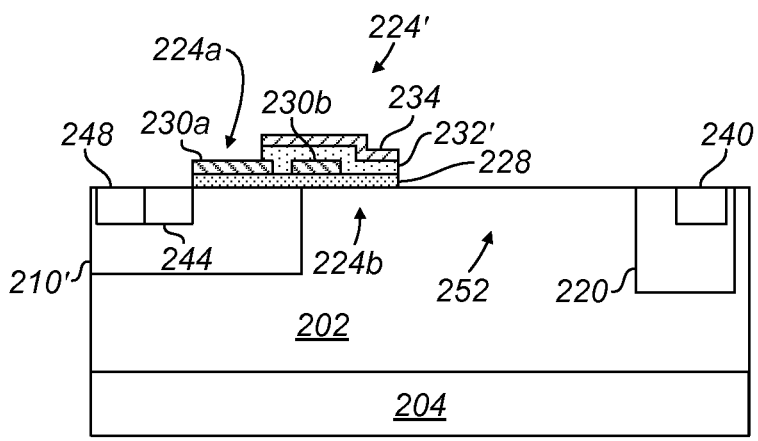
FIG. 11 shows a cross-sectional view of an LDMOS in accordance with an embodiment of the present disclosure.

The configuration of the drift region 252 having a super junction region can vary; examples are shown in FIGS. 3-9C, which are described below. Also, the configuration of the split gate 224 can vary; alternative embodiments are shown in FIGS. 10 and 11, which are described below. Any of the split gates described herein can be combined with any of the drift regions described herein, and features of any of the various embodiments described herein can be combined with one or more others of the various embodiments described herein in order to provide for still further embodiments. Also, the drift regions and split gates described herein can be applied to provide for power devices other than LDMOS devices. For example, the descriptions of the drift regions and split gates provided herein in association with exemplary LDMOS devices can apply equally to other power devices, for example EDMOS devices such as those shown in FIGS. 12 and 13, which are described below.

Figure 3:
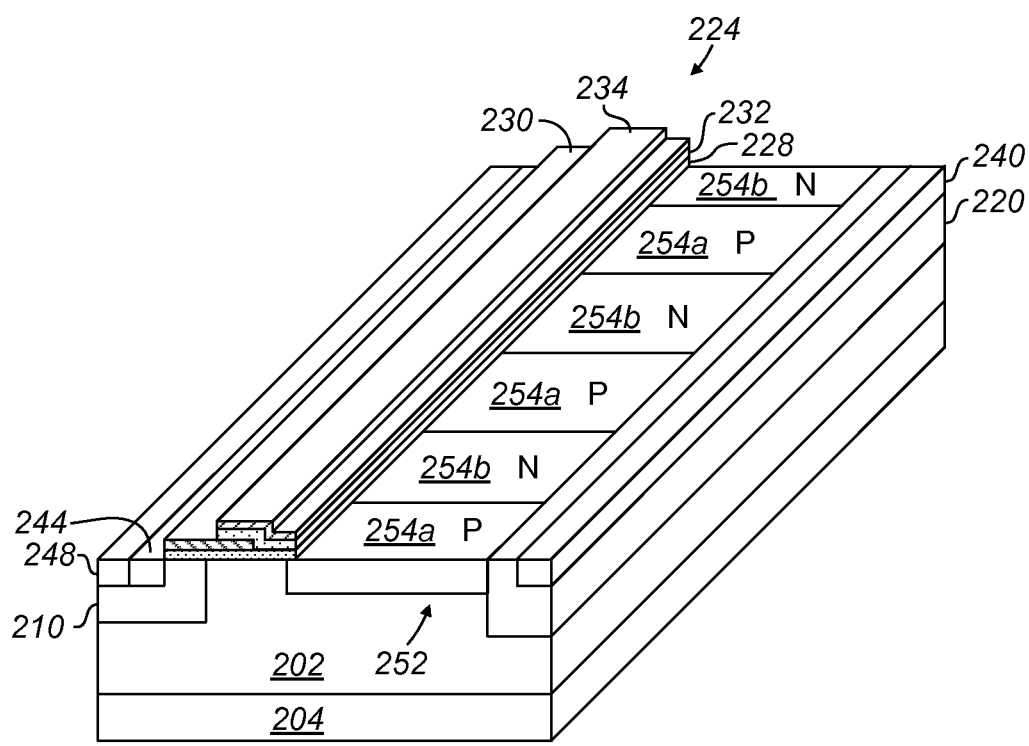
FIG. 3 shows an orthogonal view of an LDMOS in accordance with an embodiment of the present disclosure.

Turning next to FIG. 3, an embodiment of the LDMOS is shown that includes a first example of super-junction structure in the drift region 252. The super junction structure in the embodiment shown in FIG. 3 includes a series of adjoining p-pillars 254a and n-pillars 254b in the drift region 252. As shown in FIG. 3, the pillars 254 alternate between n- and p-type pillars. In this embodiment, the shapes of the p-pillars 254a and n-pillars 254b can be at least somewhat similar to that of a cuboid or rectangular parallelepiped, having an at least somewhat rectangular cross-sectional shape. Also, in this embodiment, and each of the p-pillars 254a and n-pillars 254b can extend from a region below at least a portion of the gate 224, to a point where the p-pillars 254a and n-pillars 254b adjoin the N-type well 220.

In this and other embodiments, the p-pillars 254a and n-pillars 254b can be formed through conventional masking processes, for example by selective doping of the substrate in the desired regions. The selective doping process can be performed with any conventional method, such as diffusion and/or ion implantation. Alternatively, the p-pillars 254a and n-pillars 254b can be formed by selective masking and trenching operations, including forming the p-pillars 254a and n-pillars 254b using p-type and n-type, respectively, polysilicon material to refill the trench.

Figure 4A:
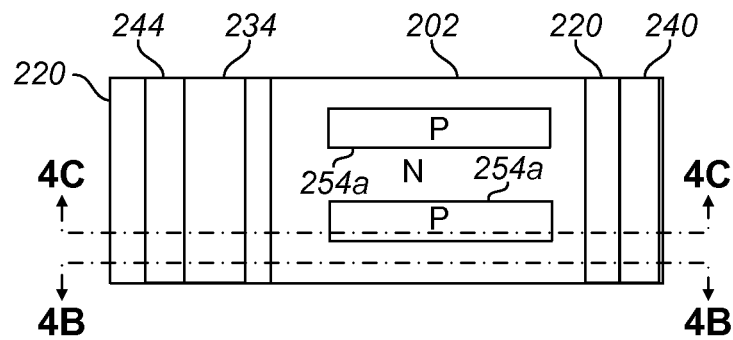
FIG. 4A shows a plan view of an LDMOS in accordance with an embodiment of the present disclosure.
Figure 4B:
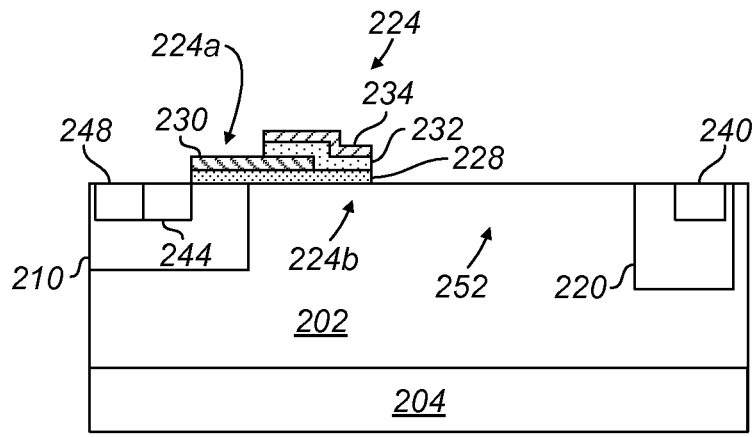
FIG. 4B shows a cross-sectional view of the LDMOS shown in FIG. 4A taken along section lines 4B-4B.
Figure 4C:
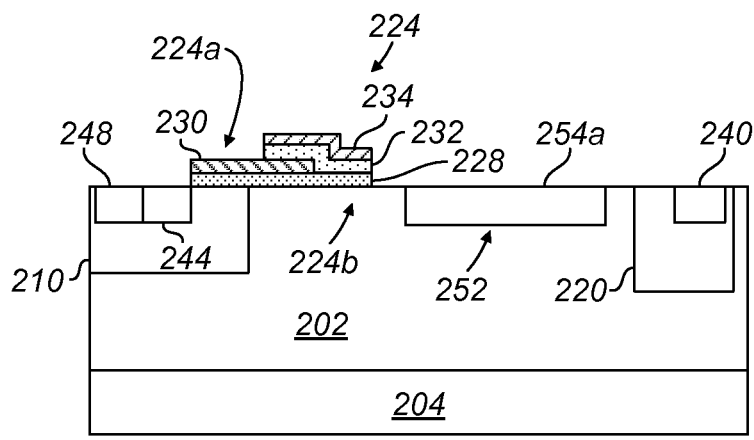
FIG. 4C shows a cross-sectional view of the LDMOS shown in FIG. 4A taken along section lines 4C-4C.

Referring next to FIGS. 4A-4C, an embodiment of the LDMOS is shown that includes a second example of super junction structure in the drift region 252. FIG. 4A shows a plan view of the LDMOS, FIG. 4B shows a cross-sectional view taken along section lines 4B-4B, and FIG. 4C shows a cross-sectional view taken along section lines 4C-4C. In this embodiment, the LDMOS includes a plurality of p-pillars 254a disposed in the HVNW 202 material of the drift region 252. The p-pillars 254a are separated from each other by n-type material of the HVNW 202, as shown in FIG. 4A. Also, this example shows that the pillars 254a do not necessarily extend below the gate 224 as shown in the example illustrated in FIG. 3. Also, this example shows that the pillars 254a do not necessarily adjoin the N-type well 220. In this embodiment, the shapes of the p-pillars 254a can be at least somewhat similar to that of a cuboid or rectangular parallelepiped, having an at least somewhat rectangular cross-sectional shape, for example when sectioned along a plane that is at least substantially parallel to the upper surface of the LDMOS, e.g., at least substantially parallel to the plan view shown in FIG. 4A.

Figure 5A:
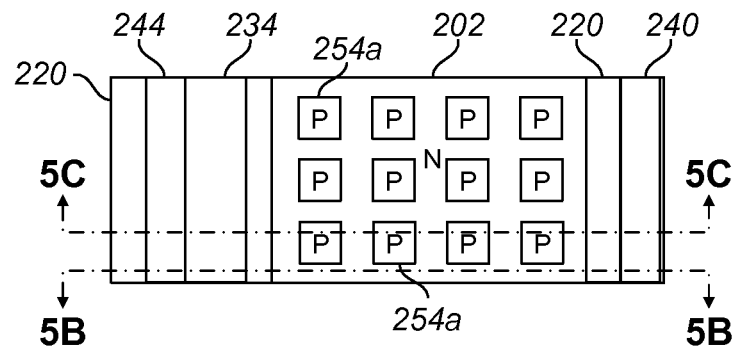
FIG. 5A shows a plan view of an LDMOS in accordance with an embodiment of the present disclosure.
Figure 5B:
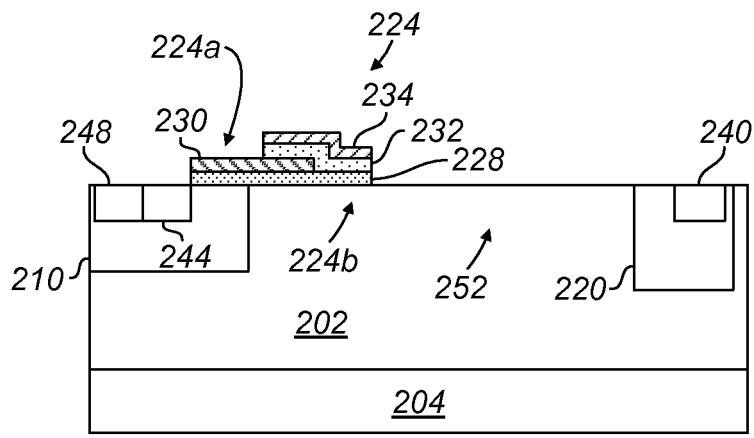
FIG. 5B shows a cross-sectional view of the LDMOS shown in FIG. 5A taken along section lines 5B-5B.
Figure 5C:
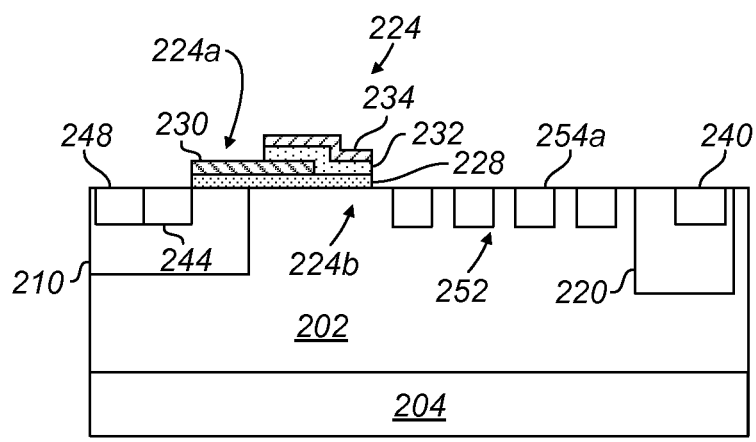
FIG. 5C shows a cross-sectional view of the LDMOS shown in FIG. 5A taken along section lines 5C-5C.

Referring next to FIGS. 5A-5C, an embodiment of the LDMOS is shown that includes a third example of super junction structure in the drift region 252. FIG. 5A shows a plan view of the LDMOS, FIG. 5B shows a cross-sectional view taken along section lines 5B-5B, and FIG. 5C shows a cross-sectional view taken along section lines 5C-5C. In this embodiment, the LDMOS includes a plurality of p-pillars 254a disposed in the HVNW 202 material of the drift region 252. The p-pillars 254a are arranged in an array of pillars that are separated by n-type material of the HVNW 202 as shown in FIG. 5A. An alternative of this example can include p-pillars 254a that at least partially extend below the gate 224 and/or pillars 254a that adjoin the N-type well 220. In this embodiment, the shapes of the p-pillars 254a can be at least somewhat similar to that of a cuboid or rectangular parallelepiped having an at least somewhat square or rectangular cross-sectional shape, for example when sectioned along a plane that is at least substantially parallel to the upper surface of the LDMOS, e.g., at least substantially parallel to the plan view shown in FIG. 5A.

Figure 6A:
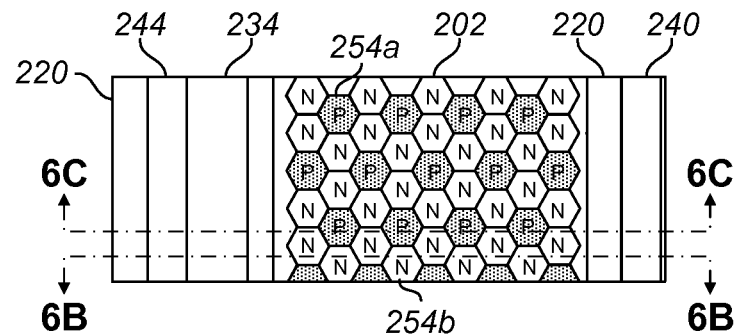
FIG. 6A shows a plan view of an LDMOS in accordance with an embodiment of the present disclosure.
Figure 6B:
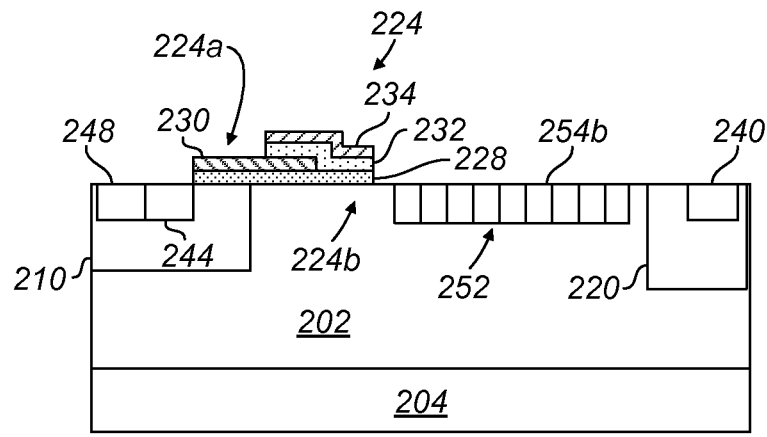
FIG. 6B shows a cross-sectional view of the LDMOS shown in FIG. 6A taken along section lines 6B-6B.
Figure 6C:
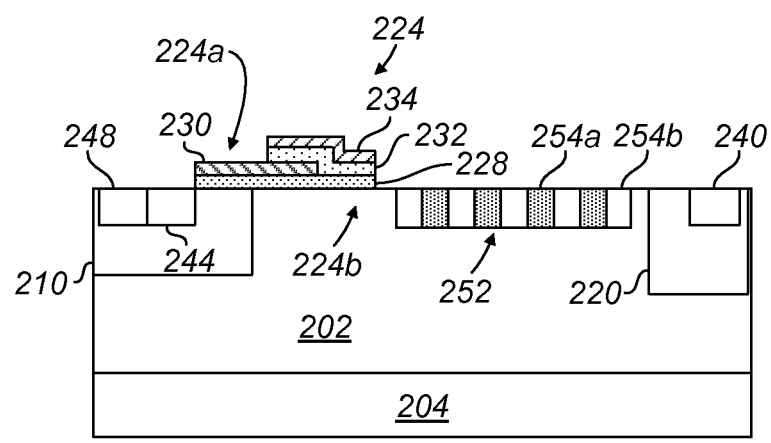
FIG. 6C shows a cross-sectional view of the LDMOS shown in FIG. 6A taken along section lines 6C-6C.

Referring next to FIGS. 6A-6C, an embodiment of the LDMOS is shown that includes a fourth example of super junction structure in the drift region 252. FIG. 6A shows a plan view of the LDMOS, FIG. 6B shows a cross-sectional view taken along section lines 6B-6B, and FIG. 6C shows a cross-sectional view taken along section lines 6C-6C. In this embodiment, the LDMOS includes a plurality of p-pillars 254a and n-pillars 254b arranged in an at least somewhat honeycomb-shaped array. The p-pillars 254a are separated by n-pillars 254b, while the n-pillars 254b can adjoin each other as shown in FIG. 6A. An alternative of this example can include p-pillars 254a and/or n-pillars 254b that at least partially extend below the gate 224 and/or p-pillars 254a and/or n-pillars 254b that adjoin the N-type well 220. In this embodiment, the shapes of the p-pillars 254a and n-pillars 254b can have an at least somewhat polygonal shape, such as hexagonal as shown in FIG. 6A, for example when sectioned along a plane that is at least substantially parallel to the upper surface of the LDMOS, e.g., at least substantially parallel to the plan view shown in FIG. 6A.

Figure 7A:
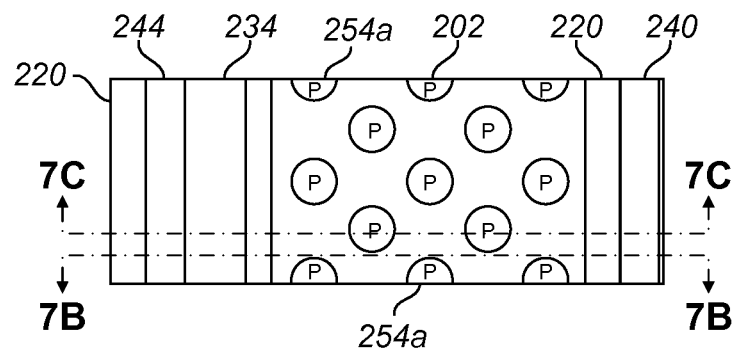
FIG. 7A shows a plan view of an LDMOS in accordance with an embodiment of the present disclosure.
Figure 7B:
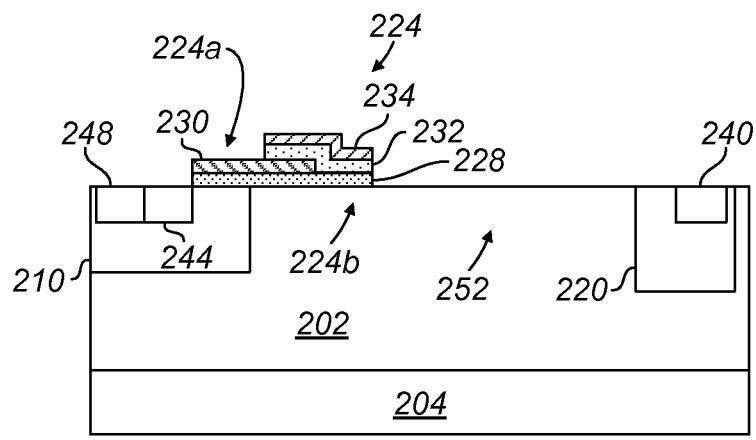
FIG. 7B shows a cross-sectional view of the LDMOS shown in FIG. 7A taken along section lines 7B-7B.
Figure 7C:
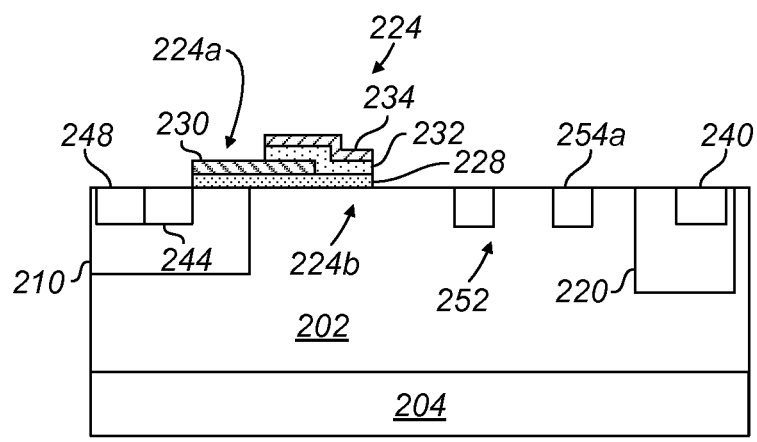
FIG. 7C shows a cross-sectional view of the LDMOS shown in FIG. 7A taken along section lines 7C-7C.

Referring next to FIGS. 7A-7C, an embodiment of the LDMOS is shown that includes a fifth example of super junction structure in the drift region 252. FIG. 7A shows a plan view of the LDMOS, FIG. 7B shows a cross-sectional view taken along section lines 7B-7B, and FIG. 7C shows a cross-sectional view taken along section lines 7C-7C. In this embodiment, the LDMOS includes a plurality of p-pillars 254a. The p-pillars 254a are separated by n-type material of the HVNW 202 as shown in FIG. 7A. An alternative of this example can include p-pillars 254a that at least partially extend below the gate 224 and/or pillars 254a that adjoin the N-type well 220. In this embodiment, the shapes of the p-pillars 254a can be at least somewhat similar to that of a cylinder having an at least somewhat circular or oval cross-sectional shape, for example when sectioned along a plane that is at least substantially parallel to the upper surface of the LDMOS, e.g., at least substantially parallel to the plan view shown in FIG. 7A.

Figure 8A:
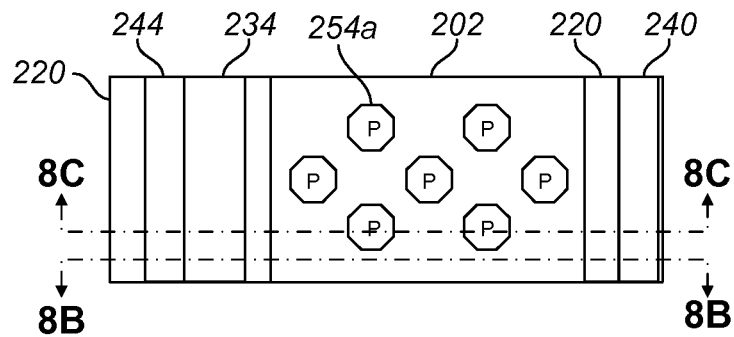
FIG. 8A shows a plan view of an LDMOS in accordance with an embodiment of the present disclosure.
Figure 8B:
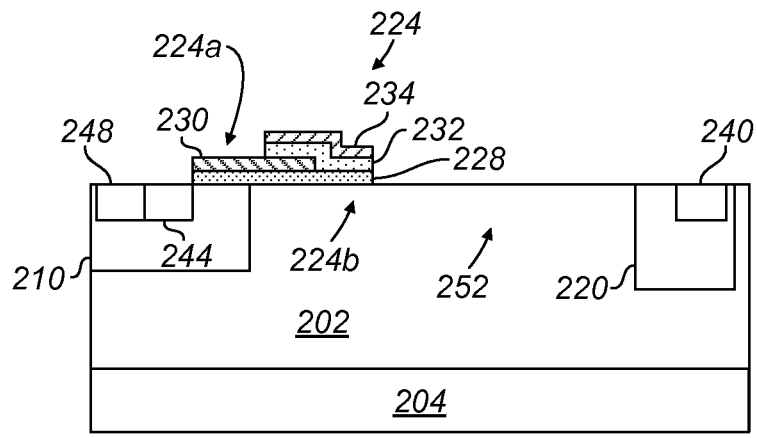
FIG. 8B shows a cross-sectional view of the LDMOS shown in FIG. 8A taken along section lines 8B-8B.
Figure 8C:
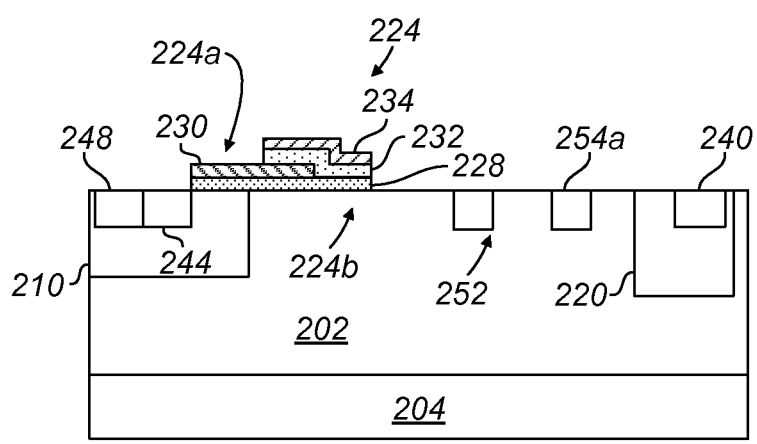
FIG. 8C shows a cross-sectional view of the LDMOS shown in FIG. 8A taken along section lines 8C-8C.

Referring next to FIGS. 8A-8C, an embodiment of the LDMOS is shown that includes a sixth example of super junction structure in the drift region 252. FIG. 8A shows a plan view of the LDMOS, FIG. 8B shows a cross-sectional view taken along section lines 8B-8B, and FIG. 8C shows a cross-sectional view taken along section lines 8C-8C. In this alternative embodiment, the LDMOS includes a plurality of p-pillars 254a separated by n-type material of the HVNW 202, as shown in FIG. 8A. An alternative of this example can include p-pillars 254a that at least partially extend below the gate 224 and/or pillars 254a that adjoin the N-type well 220. In this embodiment, the shapes of the p-pillars 254a can be at least somewhat similar to that of a polygonal prism, such as a hexagonal prism as shown in FIGS. 8A and 8C. The p-pillars 254a can have an at least somewhat hexagonal (or other polygon) cross-sectional shape, for example when sectioned along a plane that is at least substantially parallel to the upper surface of the LDMOS, e.g., at least substantially parallel to the plan view shown in FIG. 8A.

Figure 9A:
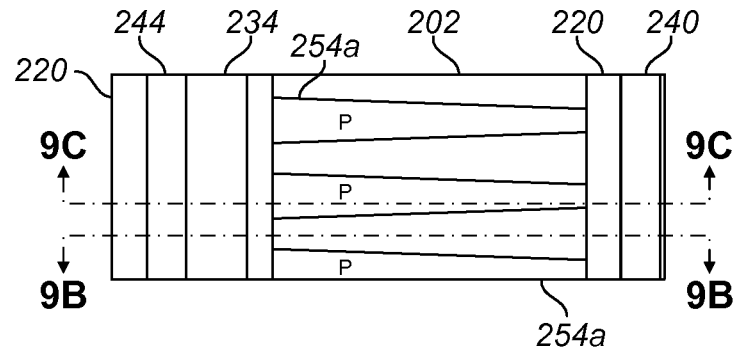
FIG. 9A shows a plan view of an LDMOS in accordance with an embodiment of the present disclosure.
Figure 9B:
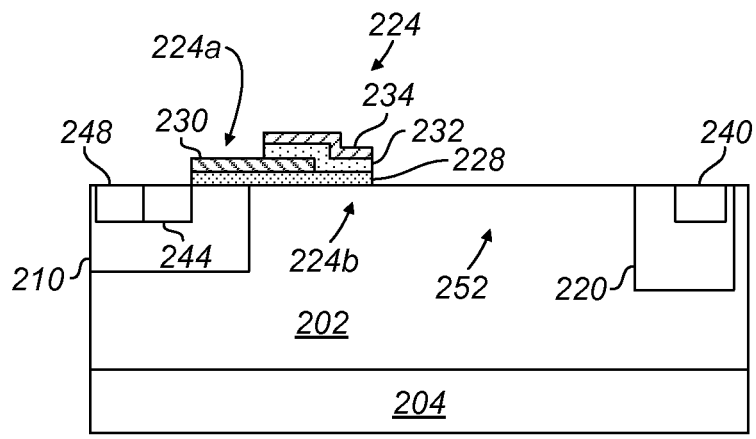
FIG. 9B shows a cross-sectional view of the LDMOS shown in FIG. 9A taken along section lines 9B-9B.
Figure 9C:
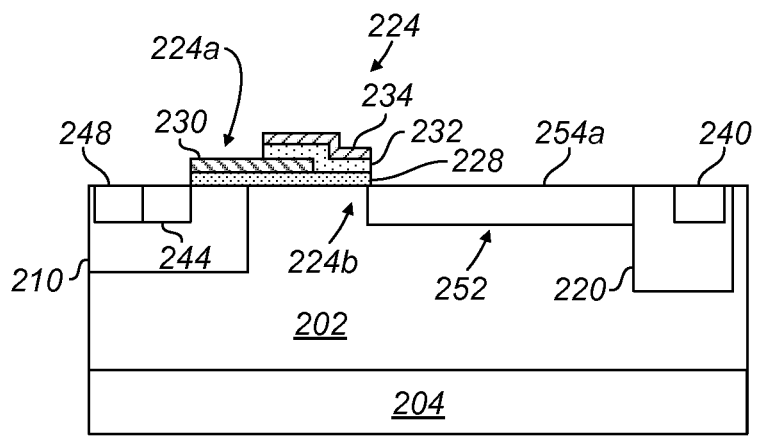
FIG. 9C shows a cross-sectional view of the LDMOS shown in FIG. 9A taken along section lines 9C-9C.

Referring next to FIGS. 9A-9C, an embodiment of the LDMOS is shown that includes a seventh example of super junction structure in the drift region 252. FIG. 9A shows a plan view of the LDMOS, FIG. 9B shows a cross-sectional view taken along section lines 9B-9B, and FIG. 9C shows a cross-sectional view taken along section lines 9C-9C. In this embodiment, the LDMOS includes a plurality of tapered p-pillars 254a disposed in the HVNW 202 material of the drift region 252. The p-pillars 254a are separated from each other by n-type material of the HVNW 202, as shown in FIG. 9A. In the illustrated embodiment, each of the p-pillars 254a extend from a region below at least a portion of the gate 224, to a point where the p-pillars 254a adjoin the N-type well 220. However, in alternative embodiments, the p-pillars 254a do not necessarily extend below the gate 224 and the pillars 254a do not necessarily adjoin the N-type well 220. In this embodiment, the shapes of the p-pillars 254a can have an at least somewhat trapezoidal cross-sectional shape, where the side of the trapezoid adjacent to the gate 224 is wider than the side of the trapezoid adjacent to the N-type well 220, for example when sectioned along a plane that is at least substantially parallel to the upper surface of the LDMOS, e.g., at least substantially parallel to the plan view shown in FIG. 9A.

Any of the super junction structures shown in FIGS. 3-9C, and combinations thereof, can be used with the LDMOS having the split gate 224 shown in FIG. 2. Alternatively, any of the super junction structures shown in FIGS. 3-9C, and combinations thereof, can be used with an LDMOS having and alternative split gate, such as the split gate 224' shown in FIGS. 10 and 11, and/or an alternative P-type well, such as the P-type well 210' shown in FIG. 11. The alternative split gate 224' includes an alternative HTO layer 232' that divides the first polysilicon layer 230 into a first region 230a and a second region 230b. As shown in FIG. 10, the first region 230a can extend over a portion of the P-type well 210 and over a portion of the HVNW 202. Alternatively, as shown in FIG. 11, the P-type well 210 can be extended to form an alternative P-type well 210' so that both the first region 230a is entirely over the P-type well 210' and at least a portion of the second region 230b is also over the P-type well 210'.

Figure 12:
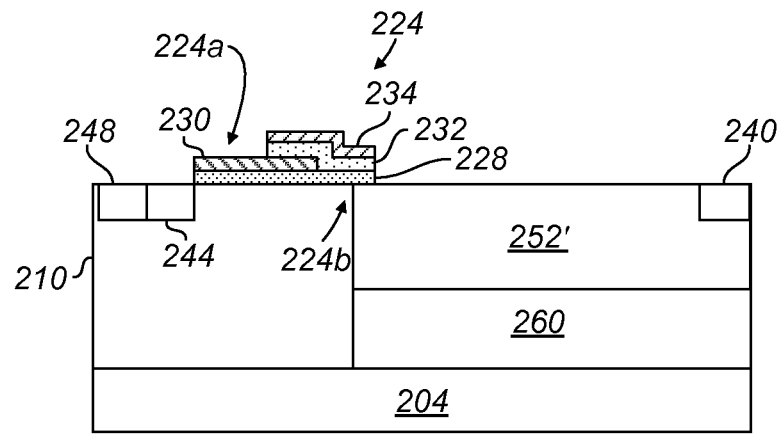
FIG. 12 shows a cross-sectional view of a buffered split gate SJ-EDMOS in accordance with an embodiment of the present disclosure.
Figure 13:
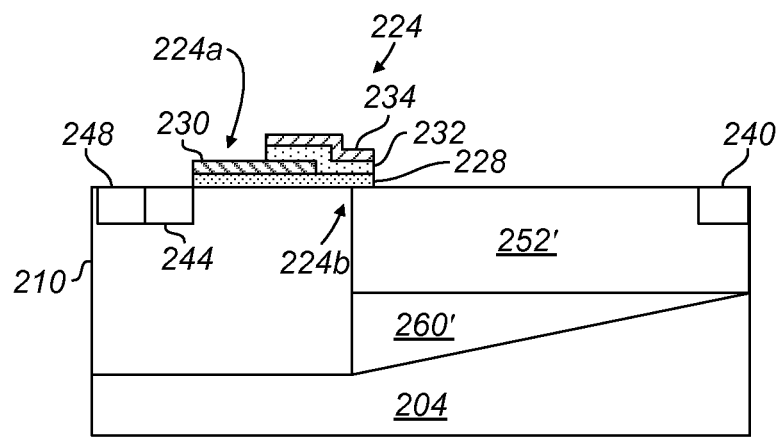
FIG. 13 shows a cross-sectional view of a graded buffered split gate SJ-EDMOS in accordance with an embodiment of the present disclosure.

FIGS. 12 and 13 show cross-sectional views of alternative MOSFET configurations that can include any of the super junction and split gate structures disclosed herein. The MOSFET devices shown in FIGS. 12 and 13 can be devices such as those commonly referred to as EDMOS devices, but include a split gate and super junction as described herein. Both of the EDMOS devices shown in FIGS. 12 and 13 include an extended drift region 252' that extends below the N+ doped region 240, in place of the N-type well 220 of the LDMOS devices. The drift regions 252' can include any of the super-junction structures disclosed herein, including combinations thereof. Also, the EDMOS devices shown in FIGS. 12 and 13 include N-buffer regions 260 and 260', respectively. The primary difference between the two is that the N-buffer region 260' is graded so as to be relatively thicker below the gate 224, and relatively thinner below the N+ doped region 240 (drain region), whereas the N-buffer region 260 is at least somewhat constant in thickness.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
 a source region;
 a drain region;
 a drift region between the source and drain regions;
 a split gate disposed over a portion of the drift region, and between the source and drain regions, the split gate comprising:
  a first gate oxide layer over the drift region, the first gate oxide layer having a first portion and a second portion,
  a first gate electrode layer formed over the first portion of the first gate oxide layer and not over the second portion of the first gate oxide layer,
  a second gate oxide layer formed over the second portion of the first gate oxide layer and over a portion of the first gate electrode layer, and
  a second gate electrode layer formed over the second gate oxide layer, the second gate electrode layer being in electrical contact with the first gate electrode layer; and
 a super junction structure disposed within the drift region between the gate and the drain region.

2. The semiconductor device of claim 1, wherein the split gate further comprises a third gate electrode layer formed over a third portion of the first gate oxide layer, wherein the second gate oxide layer is further formed over a fourth portion of the first gate oxide layer between the first and third gate electrode layers.

3. The semiconductor device of claim 1, further comprising a pickup region adjacent to the source region, wherein the pickup and source regions are of opposite conductivity types.

4. The semiconductor device of claim 1, wherein the drift region includes material of a first conductivity type, and wherein the super junction structure comprises a plurality of pillars of a second conductivity type opposite the first conductivity type.

5. The semiconductor device of claim 4, wherein the super junction structure comprises a second plurality of pillars of the first conductivity type.

6. The semiconductor device of claim 4, wherein the pillars are spaced apart from each other by material of the first conductivity type.

7. The semiconductor device of claim 4, wherein the first conductivity type is n-type, and the second conductivity type is p-type.

8. The semiconductor device of claim 4, wherein the plurality of pillars includes at least one pillar having a cross-sectional shape that is at least somewhat in the form of one of a rectangle, square, hexagon, circle, and trapezoid.

9. The semiconductor device of claim 1, wherein the drift region is formed in a high-voltage N-well (HVNW) region.

10. The semiconductor device of claim 1, further comprising a buffer region below the drain region.

11. The semiconductor device of claim 10, wherein the buffer region is a buffer region layer having an at least substantially constant thickness.

12. The semiconductor device of claim 10, wherein the buffer region is a buffer region layer having a varying thickness.

13. The semiconductor device of claim 1, wherein the first gate oxide layer is in contact with the second gate oxide layer.

14. The semiconductor device of claim 1, wherein a thickness of the first portion of the first gate oxide layer is substantially the same as a thickness of the second portion of the first gate oxide layer.

15. The semiconductor device of claim 1, wherein the first gate electrode layer and the second gate electrode layer are in electrical contact such that a voltage of the first and second gate electrode layers is substantially the same.

16. The semiconductor device of claim 1, wherein a thickness of oxide below the second gate electrode layer in a region defined by the second portion of the first gate oxide layer is thicker than a thickness of oxide below the second gate electrode layer in a region defined by the first portion of the first gate oxide layer.

17. A semiconductor device, comprising:
    a semiconductor layer of a first conductivity type;
    a drain region of the first conductivity type formed over the semiconductor layer;
    a source region of the first conductivity type formed over the semiconductor layer and spaced apart from the drain region such that a drift region is formed between the drain region and the source region;
    a first gate oxide layer formed over the drift region, the first gate oxide layer having a first portion and a second portion;
    a first gate electrode layer formed over the first portion of the first gate oxide layer and not over the second portion of the first gate oxide layer;
    a second gate oxide layer formed over the second portion of the first gate oxide layer and over a portion of the first gate electrode layer;
    a second gate electrode layer formed over the second gate oxide layer, the second gate electrode layer being in electrical contact with the first gate electrode layer; and
    a super junction structure formed in at least a portion of the drift region, the super-junction structure including a plurality of pillars of a second conductivity type opposite the first conductivity type.

18. The semiconductor device of claim 17, wherein the first conductivity type is n-type, and the second conductivity type is p-type.

19. The semiconductor device of claim 17, wherein the super junction structure comprises a plurality of pillars of the second conductivity type.

20. The semiconductor device of claim 19, wherein the super junction structure comprises a second plurality of pillars of the first conductivity type.

21. The semiconductor device of claim 19, wherein the pillars are spaced apart from each other by material of the first conductivity type.

22. The semiconductor device of claim 19, wherein the plurality of pillars includes at least one pillar having a cross-sectional shape that is at least somewhat in the form of one of a rectangle, square, hexagon, circle, and trapezoid.

23. The semiconductor device of claim 17, further comprising:
    a first region of the first conductivity type formed as a first well in the semiconductor layer; and
    a second region of the second conductivity type formed as a second well in the semiconductor layer, wherein the drain region is formed in the first region, and the source region is formed in the second region.

24. The semiconductor device of claim 23, further comprising a pickup region of the second conductivity type formed in the second region.

25. The semiconductor device of claim 23, further comprising a buffer region of the first conductivity type below the drain region.

26. The semiconductor device of claim 25, wherein the buffer region is a buffer region layer having an at least substantially constant thickness.

27. The semiconductor device of claim 25, wherein the buffer region is a buffer region layer having a varying thickness.

28. The semiconductor device of claim 17, further comprising a third gate electrode layer formed over a third portion of the first gate oxide layer, wherein the second gate oxide layer is further formed over a fourth portion of the first gate oxide layer between the first and third gate electrode layers.

* * * * *